(12) United States Patent
Ji

(10) Patent No.: US 11,817,159 B2
(45) Date of Patent: Nov. 14, 2023

(54) CIRCUIT FOR DETECTING ANTI-FUSE MEMORY CELL STATE AND MEMORY

(71) Applicant: CHANGXIN MEMORY TECHNOLOGIES, INC., Hefei (CN)

(72) Inventor: Rumin Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 190 days.

(21) Appl. No.: 17/445,372

(22) Filed: Aug. 18, 2021

(65) Prior Publication Data

US 2022/0020442 A1 Jan. 20, 2022

Related U.S. Application Data

(63) Continuation of application No. PCT/CN2021/097868, filed on Jun. 2, 2021.

(30) Foreign Application Priority Data

Jul. 16, 2020 (CN) .......................... 202010687695.0

(51) Int. Cl.
*G11C 17/16* (2006.01)
*G11C 17/18* (2006.01)
(Continued)

(52) U.S. Cl.
CPC .............. *G11C 17/16* (2013.01); *G11C 17/18* (2013.01); *G11C 29/12005* (2013.01);
(Continued)

(58) Field of Classification Search
CPC ....................................................... G11C 17/16
(Continued)

(56) References Cited

U.S. PATENT DOCUMENTS 7,082,061 B2 7/2006 Chou
7,333,383 B2 2/2008 Vogelsang
(Continued)

FOREIGN PATENT DOCUMENTS

CN 1828764 A 9/2006
CN 100483540 C 4/2009
(Continued)

OTHER PUBLICATIONS

International Search Report in the international application No. PCT/CN2021/097868, dated Aug. 26, 2021.
(Continued)

*Primary Examiner* — Muna A Techane
(74) *Attorney, Agent, or Firm* — SYNCODA LLC; Feng Ma

(57) ABSTRACT

A circuit for detecting an anti-fuse memory cell state includes a current providing module connected to a first node and used to provide constant current; an anti-fuse memory cell array connected to the first node and including at least one bit line, the at least one bit line is connected to a plurality of anti-fuse memory cells and the first node; and a comparator, a first input end of the comparator is connected to the first node and a second input end of the comparator is connected to a first reference voltage, and used to detect a storage state of an anti-fuse memory cell to be tested in the anti-fuse memory cell array.

16 Claims, 6 Drawing Sheets

(51) Int. Cl.
*G11C 29/46* (2006.01)
*G11C 29/12* (2006.01)

(52) U.S. Cl.
CPC ...... *G11C 29/46* (2013.01); *G11C 2029/1202* (2013.01); *G11C 2029/1204* (2013.01)

(58) Field of Classification Search
USPC .......................................................... 365/96
See application file for complete search history.

(56) References Cited

U.S. PATENT DOCUMENTS

| | | | |
|---|---|---|---|
| 8,208,336 B2 | 6/2012 | Do | |
| 8,243,542 B2 | 8/2012 | Bae | |
| 8,654,595 B2 | 2/2014 | Kim | |
| 9,099,191 B2 | 8/2015 | Tsai et al. | |
| 9,330,781 B2 | 5/2016 | Kim et al. | |
| 9,478,308 B1* | 10/2016 | Boujamaa | G11C 17/18 |
| 9,564,235 B2 | 2/2017 | Zhou et al. | |
| 9,570,192 B1* | 2/2017 | Yoon | G11C 8/14 |
| 10,121,537 B2 | 11/2018 | Rho | |
| 10,403,344 B2 | 9/2019 | Lee | |
| 10,446,204 B2 | 10/2019 | Inaba | |
| 10,459,693 B2 | 10/2019 | Lin et al. | |
| 10,658,048 B2 | 5/2020 | Conte et al. | |
| 10,693,369 B2 | 6/2020 | Ku et al. | |
| 11,114,176 B1* | 9/2021 | Lee | G11C 17/18 |
| 2006/0120174 A1 | 6/2006 | Chou | |
| 2010/0118595 A1 | 5/2010 | Bae | |
| 2010/0277999 A1 | 11/2010 | Do | |
| 2012/0182782 A1* | 7/2012 | Kurjanowicz | G11C 17/18 365/94 |
| 2013/0064008 A1 | 3/2013 | Kim | |
| 2014/0355353 A1 | 12/2014 | Tsai et al. | |
| 2015/0078081 A1 | 3/2015 | Zhou et al. | |
| 2015/0287475 A1 | 10/2015 | Kim et al. | |
| 2018/0158523 A1 | 6/2018 | Rho | |
| 2018/0197590 A1 | 7/2018 | Lee | |
| 2018/0277182 A1* | 9/2018 | Inaba | G11C 11/1655 |
| 2019/0114144 A1 | 4/2019 | Lin et al. | |
| 2019/0369966 A1 | 12/2019 | Hsu | |
| 2019/0372456 A1 | 12/2019 | Ku et al. | |
| 2020/0058360 A1 | 2/2020 | Conte et al. | |
| 2021/0343355 A1* | 11/2021 | Chung | G11C 17/18 |

FOREIGN PATENT DOCUMENTS

| | | |
|---|---|---|
| CN | 101916583 A | 12/2010 |
| CN | 103366790 A | 10/2013 |
| CN | 104217744 A | 12/2014 |
| CN | 104505123 A | 4/2015 |
| CN | 104505123 B | 4/2018 |
| CN | 108154894 A | 6/2018 |
| CN | 108288479 A | 7/2018 |
| CN | 108630265 A | 10/2018 |
| CN | 109671457 A | 4/2019 |
| CN | 109799374 A | 5/2019 |
| CN | 105913876 B | 10/2019 |
| CN | 110544500 A | 12/2019 |
| CN | 110838309 A | 2/2020 |
| CN | 210639992 U | 5/2020 |
| CN | 210925501 U | 7/2020 |
| JP | 2001319488 A | 11/2001 |

OTHER PUBLICATIONS

International Search Report in the international application No. PCT/CN2021/100976, dated Sep. 1, 2021.
International Search Report in the international application No. PCT/CN2021/097849, dated Aug. 26, 2021.
International Search Report in the international application No. PCT/CN2021/097918, dated Jul. 26, 2021.

* cited by examiner

CIRCUIT FOR DETECTING ANTI-FUSE MEMORY CELL STATE AND MEMORY

CROSS-REFERENCE TO RELATED APPLICATIONS

The application is a continuation of International Application No. PCT/CN2021/097868 filed on Jun. 2, 2021, which is claims priority to Chinese Patent Application No. 202010687695.0 filed on Jul. 16, 2020. The disclosures of these applications are hereby incorporated by reference in their entireties.

BACKGROUND

One Time Programmable (OTP) storage is widely used in various types of memories to implement redundant replacement of damaged memory cells and fine adjustment of circuit modules. Commonly used OTP storage uses a breakdown or non-breakdown state of an anti-fuse memory cell for information storage.

It should be understood that the information disclosed in the Background section above is only used to enhance the understanding of the background of the disclosure, and therefore may include information that does not constitute the related art known to those ordinary skilled in the art.

SUMMARY

The disclosure relates generally to the technical field of integrated circuits, and more specifically to a circuit for detecting an anti-fuse memory cell state and a memory applying the circuit.

The disclosure is directed to provide a circuit for detecting an anti-fuse memory cell state and a memory applying the circuit, which are used to at least solve the problem that a storage state detection result of an anti-fuse memory cell is inaccurate due to the limitation and the defect of the related art to a certain extent.

According to an aspect of the disclosure, a circuit for detecting an anti-fuse memory cell state is provided. The circuit for detecting an anti-fuse memory cell state includes: a current providing module connected to a first node and used to provide constant current; an anti-fuse memory cell array connected to the first node and including at least one bit line, herein the at least one bit line is connected to a plurality of anti-fuse memory cells and the first node; and a comparator, herein a first input end of the comparator is connected to the first node, a second input end of the comparator is connected to a first reference voltage, and the comparator is used to detect a storage state of an anti-fuse memory cell to be tested in the anti-fuse memory cell array.

According to an aspect of the disclosure, a method for detecting an anti-fuse memory cell state is provided. The method is applied to the above-mentioned circuit for detecting anti-fuse memory cell state. The method includes: controlling an anti-fuse memory cell to be tested to be electrically connected to a bit line by outputting a first control signal at a first time point to the word line of the anti-fuse memory cell to be tested to control the anti-fuse memory cell to be tested, and determining a storage state of the anti-fuse memory cell to be tested by acquiring an output signal of the comparator at a second time point to determine a storage state of the anti-fuse memory cell to be tested. The second time point is later than the first time point.

According to an aspect of the disclosure, a memory is provided. The memory includes any one of the above-mentioned circuits for detecting the anti-fuse memory cell state.

It should be understood that the above general description and the following detailed description are exemplary and explanatory only, and are not intended to limit the disclosure.

BRIEF DESCRIPTION OF THE DRAWINGS

The accompanying drawings, which are incorporated in and constitute a part of this description, illustrate embodiments consistent with the disclosure and, together with the specification, serve to explain the principles of the disclosure. Apparently, the drawings in the following description are only some embodiments of the disclosure. For those ordinary skilled in the art, other drawings can be obtained based on these drawings without involving any inventive effort.

DETAILED DESCRIPTION

Figure 1:
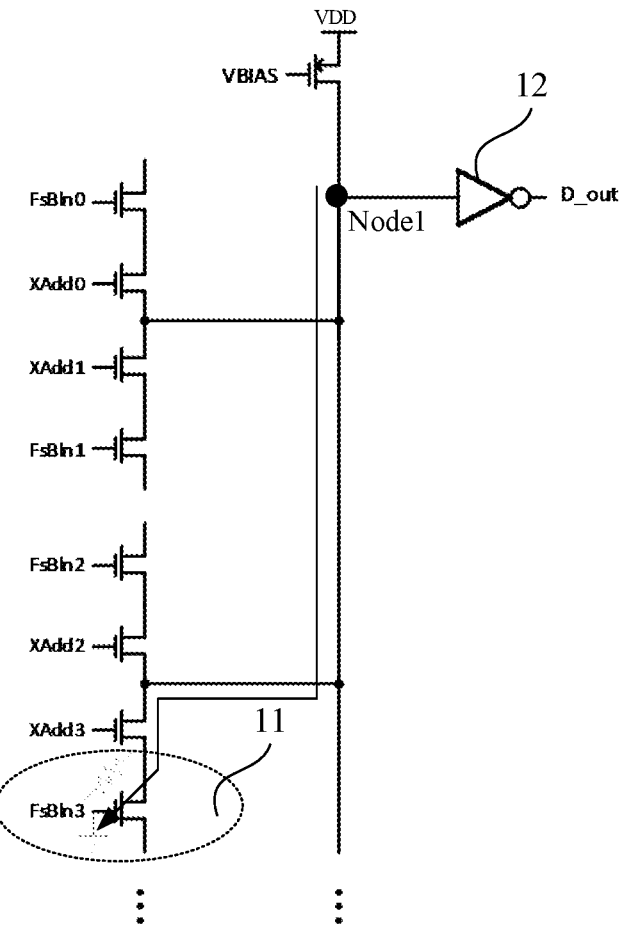
FIG. 1 is a schematic diagram of a circuit for detecting an anti-fuse memory cell state in some embodiments.

Exemplary implementations will be now described more comprehensively with reference to the accompanying drawings. However, the exemplary implementations can be implemented in a variety of forms and should not be construed as being limited to the examples set forth herein. Instead, these implementations are provided to make the disclosure more comprehensive and complete, and fully convey the concept of the exemplary implementations to those skilled in the art. The features, structures or characteristics described may be combined in one or more implementations in any proper manner. In the following description, many exemplary details are provided to give a sufficient understanding of the implementations of the disclosure. However, those skilled in the art will realize that the technical solutions of the disclosure can be implemented without one or more of the specific details, or using other methods, components, devices, steps, etc. In other states, the well-known technical solutions are not shown or described in detail to avoid distraction and obscuring of all aspects of the disclosure.

In addition, the drawings are only schematic illustrations of the disclosure, and the same reference signs in the drawings denote the same or similar parts, and thus their repeated descriptions will be omitted. Some of the block diagrams shown in the drawings are functional entities and do not necessarily correspond to physically or logically independent entities. These functional entities may be implemented in the form of software, or implemented in one or more hardware modules or integrated circuits, or implemented in different networks and/or processor devices and/or microcontroller devices.

Generally, only a simple logic gate circuit (such as an inverter) is used to detect the breakdown state of the anti-fuse memory cell. In an example, as illustrated in FIG. 1, an inverter is used to detect the breakdown state of the anti-fuse memory cell. If the anti-fuse memory cell 11 to be tested is in a state of being programmed to break down, the via resistance will be relatively small. During the detection, the voltage generated on node Node1 is relatively low, which makes an output D_out of the inverter high. On the contrary, if the anti-fuse memory cell 11 to be tested is in a state of being not programmed to break down, the via resistance will be relatively large, and the voltage generated on node Node1 will be relatively high and exceeds the flip point of the inverter, which makes the output D_out of the inverter low. Since the resistance of the anti-fuse memory cell that is broken down will fluctuate in a wide range, and factors such as process, voltage, and temperature affect the flip point of the logic gate circuit such as the inverter, a storage state detection error in the anti-fuse memory cell is easily caused, which causes a decrease in chip yield. Therefore, there is an urgent need for a circuit for detecting an anti-fuse memory cell state with higher performance.

Exemplary implementations of the disclosure will be described in detail below in conjunction with the accompanying drawings.

Figure 2:
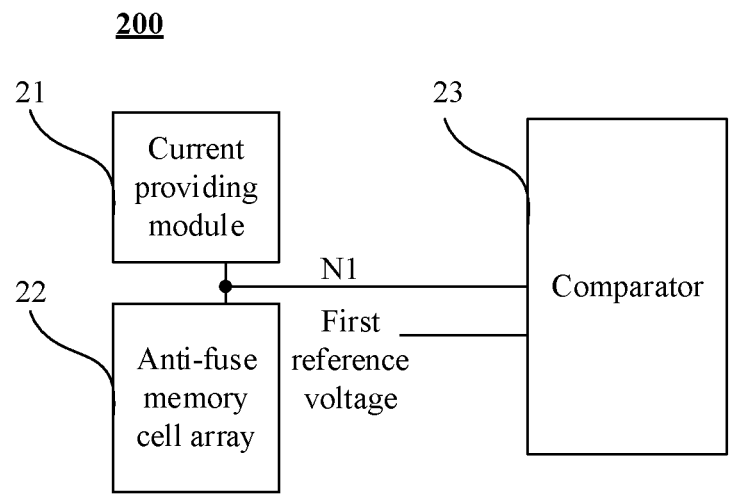
FIG. 2 is a structural schematic diagram of a circuit for detecting an anti-fuse memory cell state according to an exemplary embodiment of the disclosure.

FIG. 2 is a structural schematic diagram of a circuit for detecting an anti-fuse memory cell state according to an exemplary embodiment of the disclosure.

Referring to FIG. 2, a circuit for detecting an anti-fuse memory cell state 200 may include:

a current providing module 21 connected to a first node N1 and used to provide constant current;

an anti-fuse memory cell array 22 connected to the first node N1 and including multiple anti-fuse memory cells, herein the bit lines of the multiple anti-fuse memory cells are connected to the first node N1; and a comparator 23, herein a first input end of the comparator 23 is connected to the first node N1, a second input end of the comparator 23 is connected to a first reference voltage Vtrip, and the comparator 23 is used to detect a storage state of an anti-fuse memory cell to be tested in the anti-fuse memory cell array 22.

Figure 10:
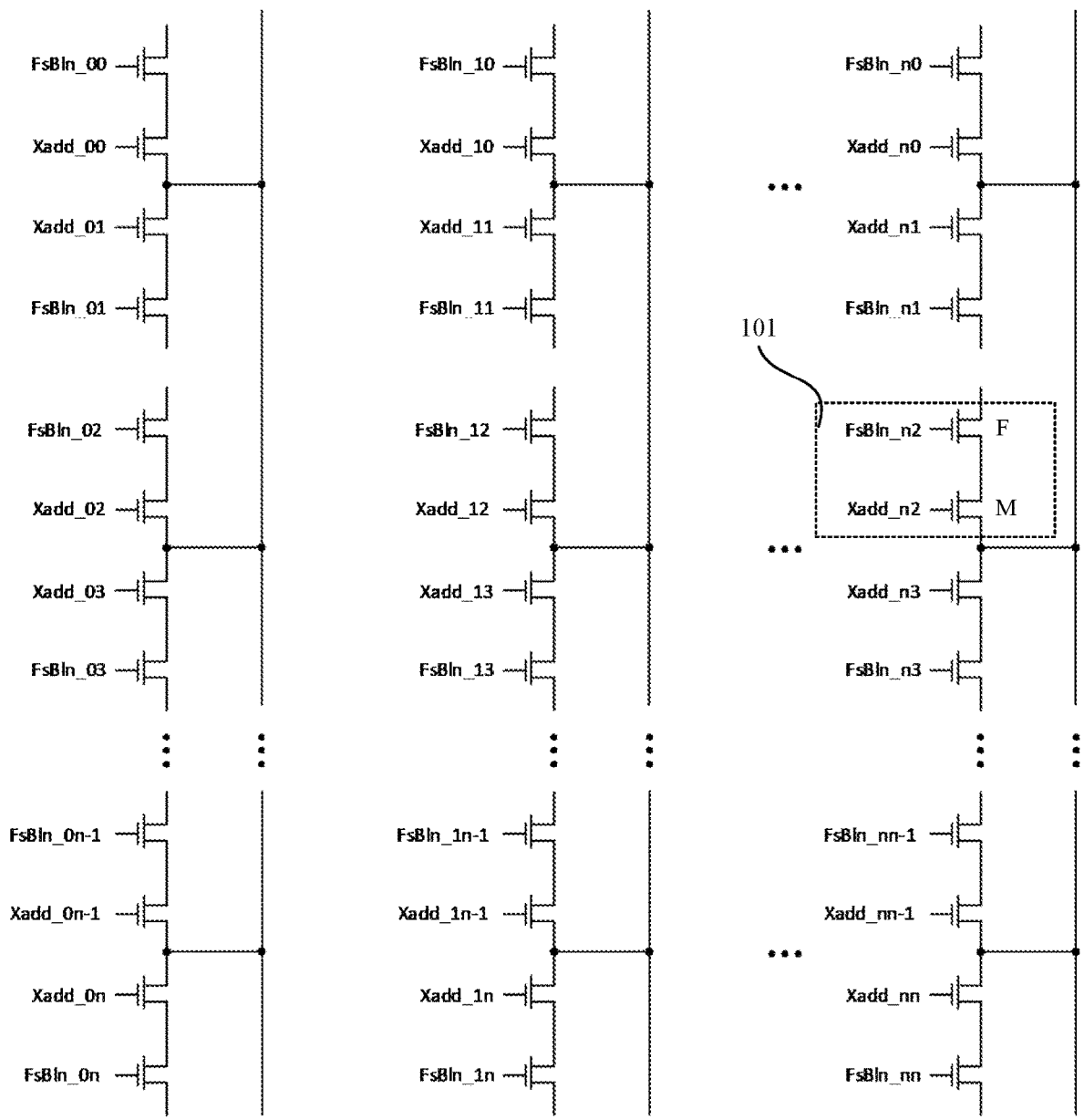
FIG. 10 is a schematic diagram of an anti-fuse memory cell according to an embodiment of the disclosure.

The structures of the anti-fuse memory cell array 22 and the anti-fuse memory cells illustrated in FIG. 2 refer to FIG. 1 and FIG. 10.

Figure 3:
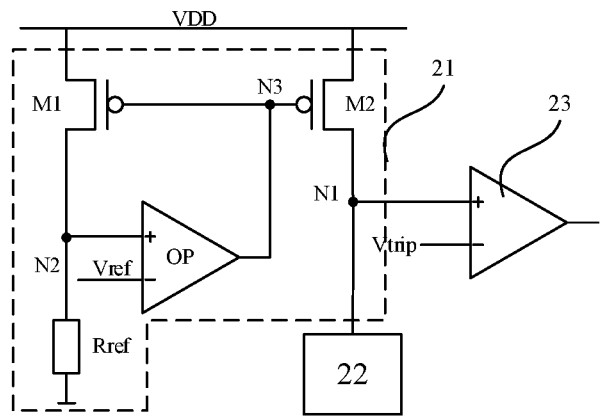
FIG. 3 is a schematic circuit diagram of a circuit for detecting an anti-fuse memory cell state according to an embodiment of the disclosure.

FIG. 3 is a schematic circuit diagram of a circuit for detecting an anti-fuse memory cell state according to an embodiment of the disclosure.

Referring to FIG. 3, in an embodiment, the current providing module 21 may include:

an amplifier OP, herein a first input end of the amplifier OP is connected to a second reference voltage Vref, a second end of the amplifier OP is connected to a second node N2, and an output end of the amplifier OP is connected to a third node N3;

a first switching element M1, herein a first end of the first switching element M1 is connected to a power voltage VDD, a second end of the first switching element M1 is connected to the second node N2, and a control end of the first switching element M1 is connected to the third node N3;

a reference resistor Rref, herein a first end of the reference resistor Rref is connected to the second node N2 and a second end of the reference resistor Rref is grounded; and a second switching element M2, herein a first end of the second switching element M2 is connected to a power voltage VDD, a second end of the second switching element M2 is connected to the first node N1, and a control end of the second switching element M2 is connected to the third node N3.

In the embodiments illustrated in FIG. 3, if both the first switching element M1 and the second switching element M2 are N-type transistors, the first input end of the amplifier OP is an in-phase input end, and the second input end of the amplifier OP is an inverted input end. If both the first switching element M1 and the second switching element M2 are P-type transistors, the first input end of the amplifier OP is an inverted input end, and the second input end of the amplifier OP is an in-phase input end. Those skilled in the art can determine a connection mode of the amplifier according to the settings of the first switching element M1 and the second switching element M2, which is not limited in the disclosure.

Figure 4:
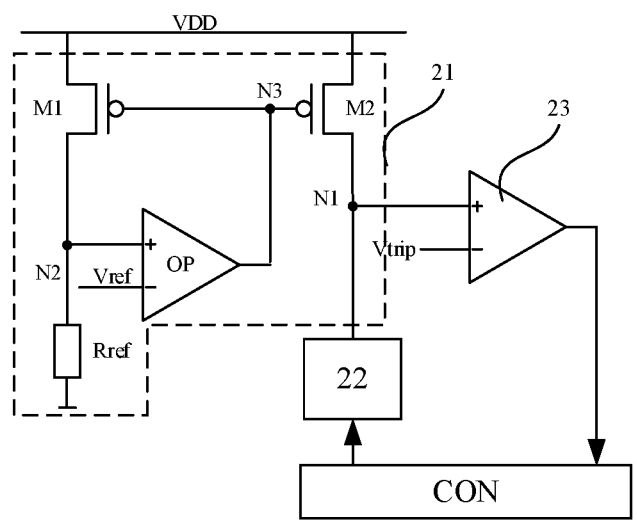
FIG. 4 is another schematic circuit diagram of a circuit for detecting an anti-fuse memory cell state in the embodiment illustrated in FIG. 3.

FIG. 4 is another schematic circuit diagram of a circuit for detecting an anti-fuse memory cell state in the embodiment illustrated in FIG. 3.

Referring to FIG. 4, in an embodiment, the anti-fuse memory cell array 22 and the comparator 23 are connected to a controller CON. Exemplarily, the controller CON is connected to a word line of each anti-fuse memory cell in the anti-fuse memory cell array 22 and to the output end of the comparator 23.

Figure 5:
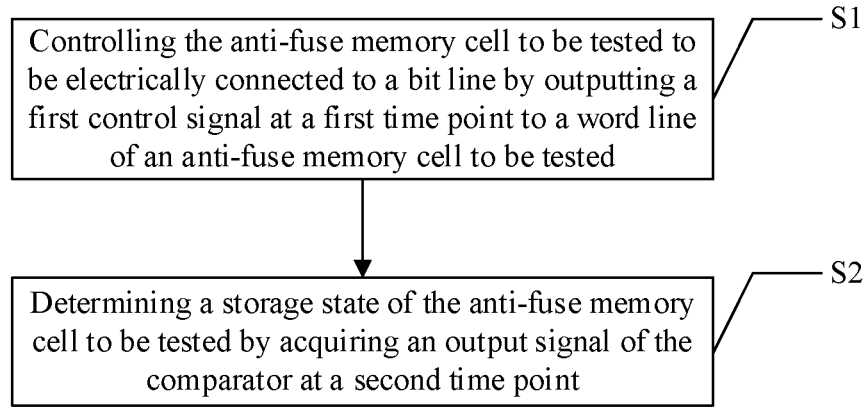
FIG. 5 is a flowchart of a detection method implemented by a controller CON in the embodiments illustrated in FIG. 4.

FIG. 5 is a flowchart of a detection method implemented by a controller CON in the embodiment illustrated in FIG. 4.

Referring to FIG. 5, the controller CON may be configured to implement the detection method 500. The detection method 500 may include the following steps.

In step S1, an anti-fuse memory cell to be tested is controlled to be electrically connected to a bit line by outputting a first control signal at a first time point to the word line of an anti-fuse memory cell to be tested.

In step S2, a storage state of the anti-fuse memory cell to be tested is determined by acquiring an output signal of the comparator at a second time point.

The second time point is later than the first time point.

The control method of FIG. 5 is explained below in conjunction with FIG. 2 to FIG. 4.

After the anti-fuse memory cell to be tested is controlled to be selected at the first time point, the first node N1 has an equivalent resistor R. The equivalent resistor R can be a resistor R1 of the anti-fuse memory cell to be tested in a breakdown state or can be a resistor R2 of the anti-fuse memory cell to be tested in a non-breakdown state. Both of the above-mentioned R1 and R2 are statistical results by statistically analyzing in research, development and production processes of anti-fuse memory cells.

The current providing module 21 provides constant current I for the first node N1 through a current mirror structure (including the amplifier OP, the first switching element M1, the second switching element M2, and the reference resistor Rref). Exemplarily, by means of the arrangement of the amplifier OP, the voltage of the second node N2 will maintain the same voltage value as the second reference voltage Vref connected to the amplifier OP, thereby generating, through the reference resistor Rref, first current in a passage where the second node N2 is located. Due to the arrangement of the first switching element M1 and the second switching element M2, second current is generated in a passage where the first node N1 is located. The second current and the first current are in a constant proportion relationship. The proportion is determined by the sizes and performance of the first switching element M1 and the second switching element M2. That is, the second current is also constant. In the embodiments of the disclosure, the second current is referred to as constant current I.

The constant current I and the equivalent resistor R of the first node N1 provide voltage V for the first node N1, V=IR. From the above-mentioned analysis, it is clear that if the equivalent resistor R is approximately equal to R1 or R2, the voltage of the first node N1 is V1=IR1 or V2=IR2, that is, the voltage of the first node N1 may be either V1 or V2.

By means of using the comparator 23 to compare the voltage of the first node N1 with the first reference voltage Vtrip, the resistance of the anti-fuse memory cell to be tested can be determined, and then the storage state of the anti-fuse memory cell to be tested is determined. In an embodiment, a differential amplifier may be used to implement the function of the comparator 23. For example, the differential amplifier (such as a simple two-stage comparator) may be set to as a self-biasing circuit to avoid excessive bias current lines and accurately control a flip point.

The method for acquiring the output signal of the comparator 23 may be reading the output signal of the comparator 23 at the second time point, or may be controlling, through an enable pin of the comparator 23, the comparator 23 to be switched to an enable state at the second time point to output a comparison result between the voltage of the first node N1 and the first reference voltage Vtrip.

In an embodiment, the maximum resistance of the anti-fuse memory cells in the breakdown state and the minimum resistance in the non-breakdown state can be determined by measuring multiple anti-fuse memory cells, and V1 and V2 are determined according to the maximum resistance in the breakdown state and the minimum resistance in the non-breakdown state. The first reference voltage Vtrip is set to be an average value of V1 and V2 to reduce the misjudgment probability as much as possible to improve the detection accuracy.

It should be understood that in order to avoid an absolute value of a difference value of Vtrip and V1 or V2 from being less than a differential voltage input threshold of the comparator 23, the differential voltage input threshold may be designed to be less than half of a difference value between V1 and V2 during design of the comparator 23, so that the comparator 23 can accurately output the comparison result between the voltage of the first node N1 and the first reference voltage Vtrip. The differential voltage input threshold described here refers to whether the comparator can identify a minimum voltage difference between a positive input end and a negative input end.

Furthermore, in order to prevent the voltage V2 of the first node N1 from exceeding an upper limit of an input voltage of the comparator 23 in the non-breakdown state of the anti-fuse memory cell to be tested, the constant current I can be adjusted by setting a proper resistance value for the reference resistor Rref, thus the value of V2 can be adjusted.

In some embodiments, a ZQ calibration resistor can be used to be the reference resistor Rref.

Figure 6:
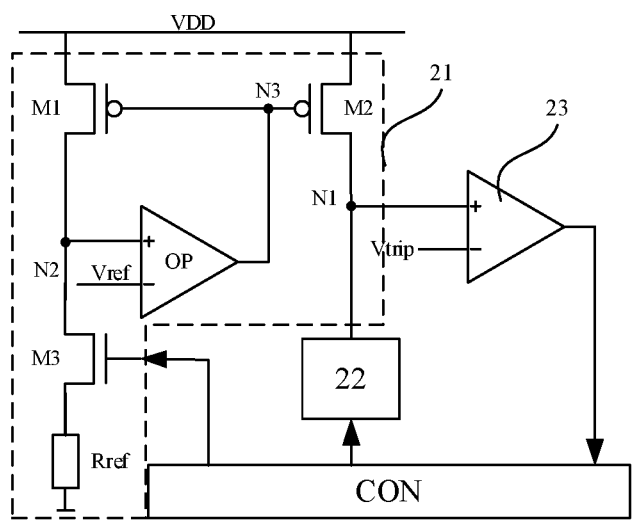
FIG. 6 is a schematic circuit diagram of a circuit for detecting an anti-fuse memory cell state according to another embodiment of the disclosure.

FIG. 6 is a schematic circuit diagram of a circuit for detecting an anti-fuse memory cell state according to another embodiment of the disclosure.

Referring to FIG. 6, the detection circuit may further include:

a third switching element M3, a first end of third switching element M3 is connected to a first end of the reference resistor Rref, a second end of third switching element M3 is connected to the second node N2, and a control end of third switching element M3 is connected to the controller CON.

At this case, the controller CON may be configured to control, at a third time point, the third switching element M3 to be switched on. The third time point is earlier than the second time point, so as to provide constant current for the first node N1.

When the reference resistor is implemented by the ZQ calibration resistor, the ZQ calibration resistor can be controlled to be connected to the circuit for detecting the anti-fuse memory cell state or be separated from the circuit for detecting the anti-fuse memory cell state by controlling the switching state of the third switching element M3, so as to ensure the security of normal operation of the ZQ calibration resistor.

Furthermore, regardless of whether the reference resistor Rref is implemented by the ZQ calibration resistor, the setting of the third switching element M3 can control the time point at which the current providing module 21 starts to provide the constant current I. That is, the time point at which the constant current I appears can be controlled by controlling the third switching element M3 to be switched on, thereby improving the accuracy of detecting the state of the anti-fuse memory cells. At this case, the third time point may be either earlier than the first time point, or later than the first time point.

Figure 7:
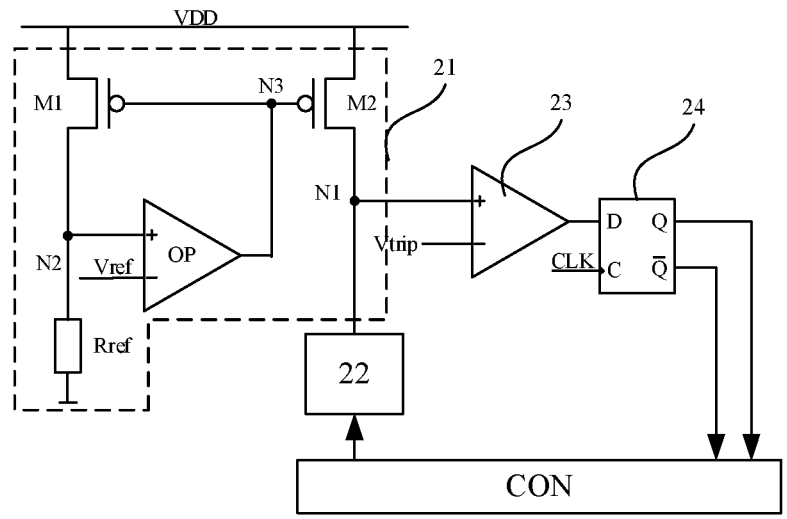
FIG. 7 is a schematic circuit diagram of a circuit for detecting an anti-fuse memory cell state according to another embodiment of the disclosure.

FIG. 7 is a schematic circuit diagram of a circuit for detecting an anti-fuse memory cell state according to another embodiment of the disclosure.

Referring to FIG. 7, in other embodiments of the disclosure, the detection circuit may further include:

a flip-flop 24. The input end of the flip-flop 24 is connected to the output end of the comparator 23. The first output end and the second output end of the flip-flop 24 are both connected to the controller CON.

The flip-flop 24 may be, for example, a D flip-flop and used to latch an output signal of the comparator 23 for the controller CON to read. Those skilled in the art can design the flip-flop 24 by self as required, which is not limited by the disclosure.

Figure 8:
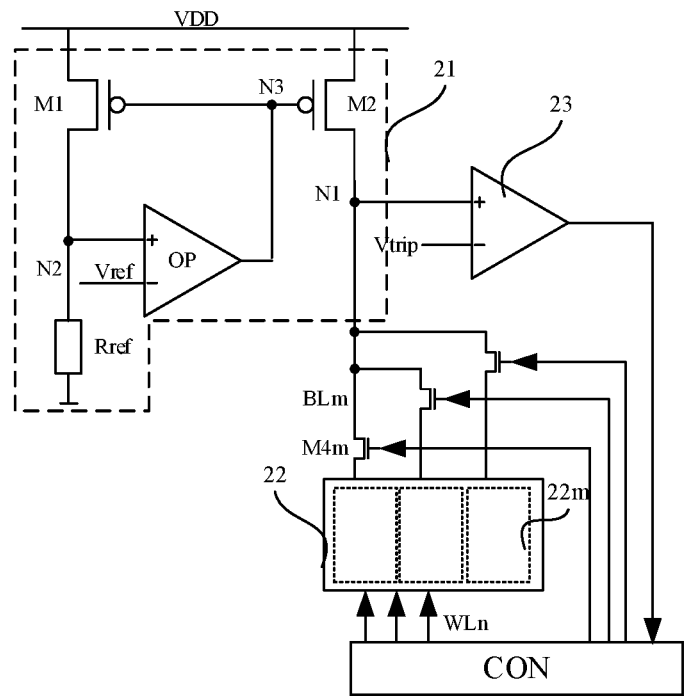
FIG. 8 is a schematic circuit diagram of a circuit for detecting an anti-fuse memory cell state according to another embodiment of the disclosure.

FIG. 8 is a schematic circuit diagram of a circuit for detecting an anti-fuse memory cell state according to another embodiment of the disclosure.

Referring to FIG. 8, in an embodiment, the first node N1 may be used to connect multiple bit lines. The anti-fuse memory cell array 22 may include:

a plurality of anti-fuse memory cell sub-arrays 22m (m is a bit line sequence number), herein each anti-fuse memory cell sub-array 22m corresponds to one bit line BLm, and each anti-fuse memory cell sub-array 22m includes multiple anti-fuse memory cells;

multiple fourth switching elements M4m corresponding to the anti-fuse memory cell sub-arrays 22m, herein a first end of each fourth switching element M4m is connected to the bit line BLm of the corresponding anti-fuse memory cell sub-array 22m, a second end of each fourth switching element M4m is connected to the first node N1, and a control end of each fourth switching element M4m is connected to the controller CON. A default state of the fourth switching element M4m is an off state.

The multiple anti-fuse memory cell sub-arrays 22m are connected to the first node N1 to share the circuit for detecting the anti-fuse storage state to detect the storage states of the anti-fuse memory cells in the multiple anti-fuse memory cell sub-arrays 22m, so that the circuit area can be greatly saved. In an embodiment, the first node N1 may be simultaneously connected with 16 bit lines. An exemplary manner is as illustrated in FIG. 8.

Figure 9:
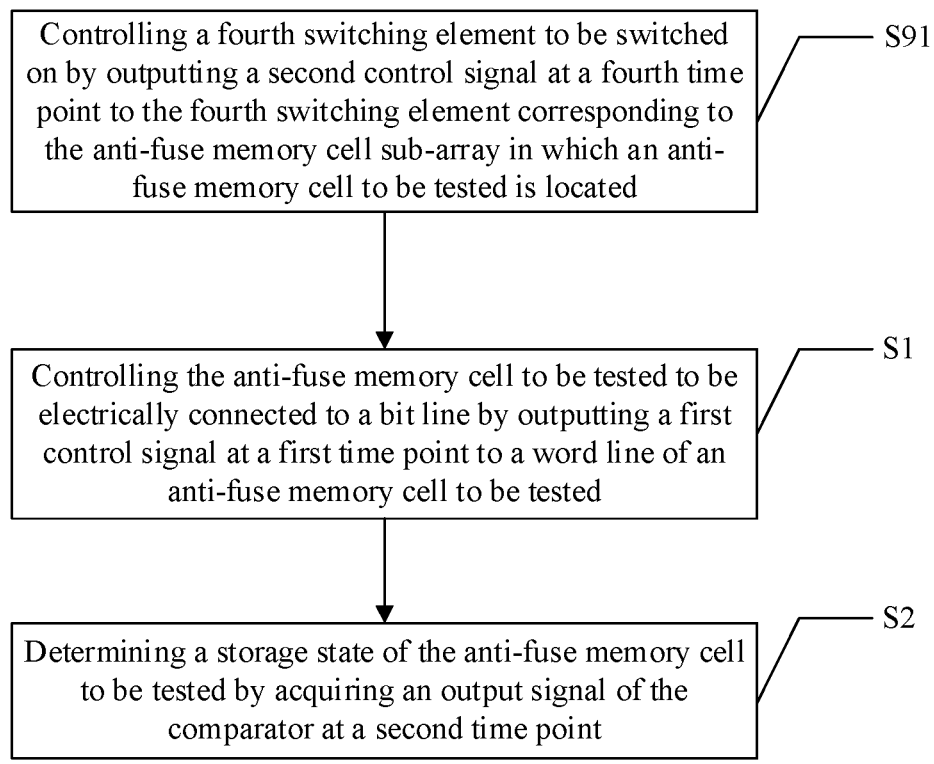
FIG. 9 is a flowchart of a detection method implemented by a controller CON in the embodiments illustrated in FIG. 8.

FIG. 9 is a flowchart of a detection method implemented by a controller CON of the embodiments illustrated in FIG. 8.

Referring to FIG. 9, in the circuit illustrated in FIG. 8, the controller CON may be configured to implement the following steps.

In step S91, a fourth switching element is controlled to be switched on by outputting a second control signal at a fourth time point to the fourth switching element corresponding to the anti-fuse memory cell sub-array in which the anti-fuse memory cell to be tested is located.

In step S1, an anti-fuse memory cell to be tested is controlled to be electrically connected to a bit line by outputting a first control signal at a first time point to the word line of the anti-fuse memory cell to be tested.

In step S2, a storage state of the anti-fuse memory cell to be tested is determined by acquiring an output signal of the comparator at a second time point.

The first time point and the fourth time point are both earlier than the second time point.

That is, the method illustrated in FIG. 5 may further include the step S91. The order of the step S91 and the step S1 may be interchanged.

In the embodiment illustrated in FIG. 9, the fourth time point may be either earlier than the first time point or later than the first time point, and may be equal to the first time point, as long as both the fourth time point and the first time point are earlier than the second time point, so that a configured current passage is opened before the voltage of the first node N1 starts to be detected at the second time point.

Furthermore, when the circuit includes the third switching element M3 of the above-mentioned embodiment, the third time point, the first time point and the fourth time point are all earlier than the second time point. The order of controlling the third switching element M3 to be switched on, controlling the fourth switching element M4m to be switched on, and controlling the anti-fuse memory cell to be tested to be electrically connected to the bit line may be interchanged, as long as these controlling operations are completed before acquiring the voltage comparison result at the second time point.

When the fourth switching element is a P-type transistor, the second control signal is a low level; and when the fourth switching element is an N-type transistor, the second control signal is a high level. When the fourth switching element is another type of element, the second control signal may also be other types of signal, which are not specifically limited by the disclosure.

FIG. 10 is a schematic diagram of an anti-fuse memory cell according to an embodiment of the disclosure.

Referring to FIG. 10, an anti-fuse memory cell 101 may include:

a selector switching element M, herein a first end of the selector switching element M is connected to the bit line of the anti-fuse memory cell 101; and an anti-fuse element F, herein a first end of the anti-fuse element F is connected to a second end of the selector switching element M.

A control end of the selector switching element M and a control end of the anti-fuse element F are connected to the controller.

The circuit for detecting the anti-fuse memory cell state provided by the embodiments of the disclosure reflects the resistance of the anti-fuse memory cell to be tested at the voltage of the first node by means of using the current providing module to provide the constant current for the first node, and compares the voltage of the first node with a first reference voltage, so that the false determination probability of the voltage can be reduced as much as possible, and an output of the comparator is more accurate; and the false determination on the storage state of the anti-fuse memory cells due to resistance fluctuation in the breakdown state of the anti-fuse memory cells and deflection of a flip voltage of a logic gate is avoided.

According to an aspect of the disclosure, a memory is provided. The memory includes any one of the circuits for detecting the above-mentioned anti-fuse memory cell state. The memory may be, for example, a Dynamic Random Access Memory (DRAM).

It should be understood that although several modules or units of the device for action execution are mentioned in the above detailed description, this division is not mandatory. In fact, according to the implementations of the disclosure, the features and functions of two or more modules or units described above may be embodied in one module or unit. On the contrary, the features and functions of a module or unit described above can be further implemented by multiple modules or units.

After considering the description and implementing the disclosure disclosed here, those skilled in the art will easily conceive other implementations of the disclosure. The present disclosure is intended to cover any variations, uses, or adaptive changes of the disclosure. These variations, uses, or adaptive changes follow the general principles of the disclosure and include common general knowledge or conventional technical means in the technical field, which are not disclosed herein. The description and embodiments are only regarded as exemplary, the true scope and concept of the disclosure are indicated by the claims.

The embodiments of the disclosure reflect the resistance of the anti-fuse memory cell to be tested at the voltage of the first node by means of using the constant current, and compares the voltage of the first node with a first reference voltage using the comparator to determine the resistance of the anti-fuse memory cell to be tested, thus the storage state of the anti-fuse memory cell to be tested can be determined, so that the flip point can be accurately controlled, and a more accurate detection result can be obtained; and misjudgment on the storage state of an anti-fuse memory cells due to resistance fluctuation in the breakdown state of the anti-fuse memory cells and deflection of the flip point of a logic gate is avoided.

What is claimed is:

1. A circuit for detecting an anti-fuse memory cell state, comprising:
   a current providing module connected to a first node and used to provide constant current;
   an anti-fuse memory cell array connected to the first node and comprising at least one bit line, the at least one bit line being connected to a plurality of anti-fuse memory cells and the first node; and a comparator, wherein a first input end of the comparator is connected to the first node, a second input end of the comparator is connected to a first reference voltage, and the comparator is used to detect a storage state of an anti-fuse memory cell to be tested in the anti-fuse memory cell array;

wherein the current providing module comprises:

an amplifier, wherein a first input end of the amplifier is connected to a second reference voltage, a second input end of the amplifier is connected to a second node, and an output end of the amplifier is connected to a third node;

a first switching element, wherein a first end of the first switching element is connected to a power voltage, a second end of the first switching element is connected to the second node, and a control end of the first switching element is connected to the third node;

a reference resistor, wherein a first end of the reference resistor is connected to the second node and a second end of the reference resistor is grounded; and a second switching element, wherein a first end of the second switching element is connected to the power voltage, a second end of the second switching element is connected to the first node and a control end of the second switching element is connected to the third node.

2. The circuit for detecting the anti-fuse memory cell state of claim 1, further comprising:

a flip-flop, an input end of the flip-flop being connected to an output end of the comparator.

3. The circuit for detecting the anti-fuse memory cell state of claim 1, wherein word lines of the plurality of anti-fuse memory cells and the output end of the comparator are connected with a controller.

4. The circuit for detecting the anti-fuse memory cell state of claim 2, wherein word lines of the plurality of anti-fuse memory cells and an output end of the flip-flop are connected with a controller.

5. The circuit for detecting the anti-fuse memory cell state of claim 3, wherein the controller is configured to:

control the anti-fuse memory cell to be tested to be electrically connected to a respective bit line by outputting a first control signal at a first time point to a word line of the anti-fuse memory cell to be tested, and determine a storage state of the anti-fuse memory cell to be tested by acquiring an output signal of the comparator at a second time point;

wherein the second time point is later than the first time point.

6. The circuit for detecting the anti-fuse memory cell state of claim 4, wherein the controller is configured to:

control the anti-fuse memory cell to be tested to be electrically connected to a respective bit line by outputting a first control signal at a first time point to a word line of the anti-fuse memory cell to be tested, and determine a storage state of the anti-fuse memory cell to be tested by acquiring an output signal of the comparator at a second time point;

wherein the second time point is later than the first time point.

7. The circuit for detecting the anti-fuse memory cell state of claim 1, wherein the reference resistor is a ZQ calibration resistor.

8. The circuit for detecting the anti-fuse memory cell state of claim 7, wherein a first end of the reference resistor is connected to the second node through a third switching element; a control end of the third switching element is connected to a controller; the controller is configured to control the third switching element to be switched on at a third time point; and the third time point is earlier than the second time point.

9. The circuit for detecting the anti-fuse memory cell state of claim 1, wherein the anti-fuse memory cell array comprises:

a plurality of anti-fuse memory cell sub-arrays, each anti-fuse memory cell sub-array corresponding to one bit line, and each anti-fuse memory cell sub-array comprising a plurality of anti-fuse memory cells; and a plurality of switching elements corresponding to the anti-fuse memory cell sub-arrays, a first end of each switching element being connected to a bit line of the corresponding anti-fuse memory cell sub-array and a second end of each switching element being connected to the first node, wherein a default state of the switching element is an off state.

10. The circuit for detecting the anti-fuse memory cell state of claim 9, wherein a control end of each switching element is connected to a controller, and the controller is configured to:

control a switching element to be switched on by outputting a second control signal at a fourth time point to the switching element corresponding to an anti-fuse memory cell sub-array in which the anti-fuse memory cell to be tested is located;

control the anti-fuse memory cell to be tested to be electrically connected to a respective bit line by outputting a first control signal at a first time point to a word line of the anti-fuse memory cell to be tested to; and determine a storage state of the anti-fuse memory cell to be tested by acquiring an output signal of the comparator at a second time point, wherein the fourth time point is earlier than the second time point.

11. A memory, comprising circuit for detecting the anti-fuse memory cell state, wherein the circuit for detecting the anti-fuse memory cell state comprises:

a current providing module connected to a first node and used to provide constant current;

an anti-fuse memory cell array connected to the first node and comprising at least one bit line, the at least one bit line being connected to a plurality of anti-fuse memory cells and the first node; and a comparator, wherein a first input end of the comparator is connected to the first node, a second input end of the comparator is connected to a first reference voltage, and the comparator is used to detect a storage state of an anti-fuse memory cell to be tested in the anti-fuse memory cell array;

wherein the current providing module comprises:

an amplifier, wherein a first input end of the amplifier is connected to a second reference voltage, a second input end of the amplifier is connected to a second node, and an output end of the amplifier is connected to a third node;

a first switching element, wherein a first end of the first switching element is connected to a power voltage, a second end of the first switching element is connected to the second node, and a control end of the first switching element is connected to the third node;

a reference resistor, wherein a first end of the reference resistor is connected to the second node and a second end of the reference resistor is grounded; and a second switching element, wherein a first end of the second switching element is connected to the power voltage, a second end of the second switching element is connected to the first node and a control end of the second switching element is connected to the third node.

12. The memory of claim 11, wherein the circuit for detecting the anti-fuse memory cell state further comprises:
a flip-flop, an input end of the flip-flop being connected to an output end of the comparator.

13. The memory of claim 11, wherein word lines of the plurality of anti-fuse memory cells and the output end of the comparator are connected with a controller.

14. The memory of claim 12, wherein word lines of the plurality of anti-fuse memory cells and an output end of the flip-flop are connected with a controller.

15. The memory of claim 13, wherein the controller is configured to:

control the anti-fuse memory cell to be tested to be electrically connected to a respective bit line by outputting a first control signal at a first time point to a word line of the anti-fuse memory cell to be tested, and determine a storage state of the anti-fuse memory cell to be tested by acquiring an output signal of the comparator at a second time point;

wherein the second time point is later than the first time point.

16. The memory of claim 14, wherein the controller is configured to:

control the anti-fuse memory cell to be tested to be electrically connected to a respective bit line by outputting a first control signal at a first time point to a word line of the anti-fuse memory cell to be tested, and determine a storage state of the anti-fuse memory cell to be tested by acquiring an output signal of the comparator at a second time point;

wherein the second time point is later than the first time point.

* * * * *